United States Patent
Ryan

(10) Patent No.: US 10,146,225 B2
(45) Date of Patent: Dec. 4, 2018

(54) SYSTEMS AND METHODS FOR VEHICLE DIMENSION PREDICTION

(71) Applicant: GM GLOBAL TECHNOLOGY OPERATIONS LLC, Detroit, MI (US)

(72) Inventor: Lawrence Ryan, Menlo Park, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/447,612

(22) Filed: Mar. 2, 2017

(65) Prior Publication Data

US 2018/0253095 A1 Sep. 6, 2018

(51) Int. Cl.
| | | |
|---|---|---|
| G05D 1/00 | (2006.01) | |
| G06N 3/08 | (2006.01) | |
| G06N 3/04 | (2006.01) | |
| G06F 17/50 | (2006.01) | |

(52) U.S. Cl.
CPC ....... *G05D 1/0088* (2013.01); *G06F 17/5009* (2013.01); *G06N 3/0445* (2013.01); *G06N 3/08* (2013.01)

(58) Field of Classification Search
USPC .......................................................... 701/27
See application file for complete search history.

(56) References Cited

U.S. PATENT DOCUMENTS

| | | | | |
|---|---|---|---|---|
| 9,315,192 B1* | 4/2016 | Zhu | ........................ | B60W 30/18 |
| 9,495,874 B1* | 11/2016 | Zhu | ........................ | G06N 3/00 |
| 9,511,767 B1* | 12/2016 | Okumura | ............. | G08G 1/0133 |
| 9,524,461 B1* | 12/2016 | Huynh | ...................... | G06N 3/04 |
| 9,766,626 B1* | 9/2017 | Zhu | .................... | B60W 30/0956 |
| 9,767,367 B2* | 9/2017 | Ishigami | ................. | G06T 7/292 |
| 9,804,597 B1* | 10/2017 | Ferguson | ............. | G05D 1/0231 |
| 2010/0106356 A1* | 4/2010 | Trepagnier | ........... | G01S 17/023 701/25 |
| 2013/0197736 A1* | 8/2013 | Zhu | ...................... | G05D 1/0088 701/26 |
| 2015/0341633 A1* | 11/2015 | Richert | .................. | H04N 19/50 375/240.16 |
| 2016/0026182 A1* | 1/2016 | Boroditsky | ........... | H04L 67/306 701/23 |
| 2016/0210775 A1* | 7/2016 | Alaniz | ................. | G05D 1/0088 |
| 2016/0334230 A1* | 11/2016 | Ross | ................... | G01C 21/3415 |
| 2016/0334797 A1* | 11/2016 | Ross | .................... | G05D 1/0027 |
| 2016/0358475 A1* | 12/2016 | Prokhorov | ........... | G05D 1/0011 |

* cited by examiner

*Primary Examiner* — Tyler D Paige
(74) *Attorney, Agent, or Firm* — Lorenz & Kopf, LLP

(57) ABSTRACT

Systems and method are provided for controlling a vehicle. In one embodiment, a vehicle dimension prediction method includes producing a set of simulated observed dimensions based a set of known vehicle dimensions and training a machine learning module based on the set of simulated observed dimensions and the set of known vehicle dimensions. The method further includes acquiring sensor data associated with a first vehicle observed by a sensor system of an autonomous vehicle, determining observed dimensions of the first vehicle based on the acquired sensor data, and determining, with a processor, predicted actual dimensions of the first vehicle by applying the plurality of observed dimensions to the machine learning model.

20 Claims, 7 Drawing Sheets

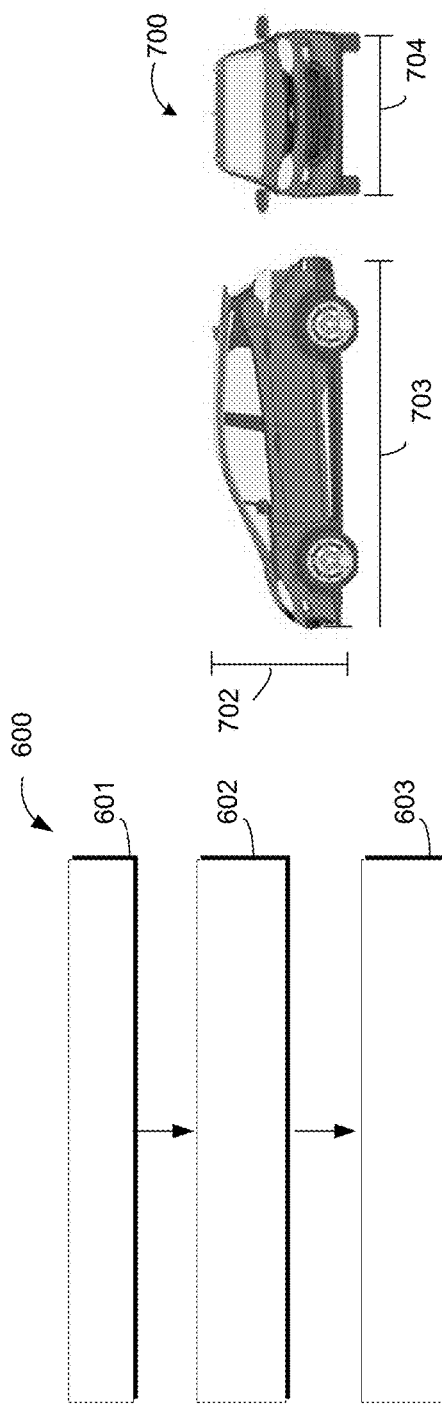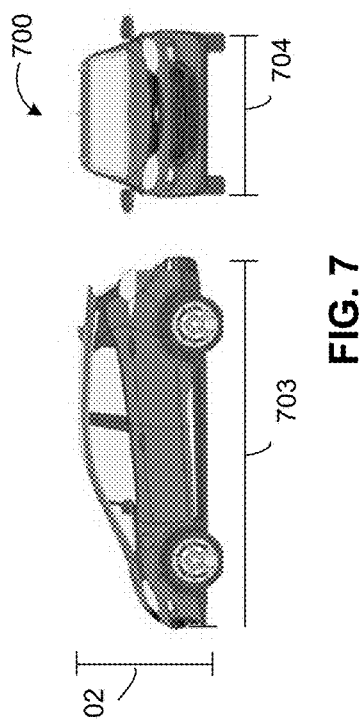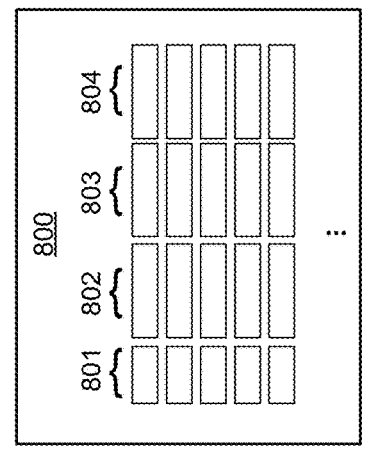

SYSTEMS AND METHODS FOR VEHICLE DIMENSION PREDICTION

TECHNICAL FIELD

The present disclosure generally relates to autonomous vehicles, and more particularly relates to systems and methods for predicting the dimensions of vehicles observed by various sensors of an autonomous vehicle.

BACKGROUND

An autonomous vehicle (AV) is a vehicle that is capable of sensing its environment and navigating with little or no user input. It does so by employing sensing devices such as radar, lidar, image sensors, and the like. Autonomous vehicles further use information from global positioning systems (GPS) technology, navigation systems, vehicle-to-vehicle communication, vehicle-to-infrastructure technology, and/or drive-by-wire systems to navigate the vehicle.

While recent years have seen significant advancements in AVs, such systems might still be improved in a number of respects. For example, it would be advantageous for AVs to be capable of determining the actual dimensions of vehicles that it encounters during operation. That is, while AVs are equipped with advanced sensor systems that can characterize, in a number of ways, the observed dimensions of vehicle and other objects in the vicinity (e.g., vehicles seen from the side, from the front, etc.), the actual dimensions of those objects are not always derivable, due in part to the varying orientation of the observed vehicle from the viewpoint of the sensors.

Accordingly, it is desirable to provide systems and methods that are capable of more accurately determining the actual dimensions of a vehicle observed by sensor systems. Furthermore, other desirable features and characteristics of the present invention will become apparent from the subsequent detailed description and the appended claims, taken in conjunction with the accompanying drawings and the foregoing technical field and background.

SUMMARY

Systems and method are provided for controlling an autonomous vehicle. In one embodiment, a vehicle dimension prediction method includes producing a set of simulated observed dimensions based a set of known vehicle dimensions and training a machine learning module based on the set of simulated observed dimensions and the set of known vehicle dimensions. The method further includes acquiring sensor data associated with a first vehicle observed by a sensor system of an autonomous vehicle, determining observed dimensions of the first vehicle based on the acquired sensor data, and determining, with a processor, predicted actual dimensions of the first vehicle by applying the plurality of observed dimensions to the machine learning model.

In one embodiment, a system for controlling a vehicle includes a vehicle dimension prediction module configured to acquire sensor data associated with a first vehicle observed by a sensor system of an autonomous vehicle and determine a plurality of observed dimensions of the first vehicle based on the acquired sensor data. The vehicle dimension prediction module is further configured to determine a plurality of predicted actual dimensions of the first vehicle by applying the plurality of observed dimensions to a machine learning model, wherein the machine learning model is trained by producing a set of simulated observed dimensions based the set of known vehicle dimensions and training the machine learning module based on a set of simulated observed dimensions and a set of known vehicle dimensions.

DESCRIPTION OF THE DRAWINGS

The exemplary embodiments will hereinafter be described in conjunction with the following drawing figures, wherein like numerals denote like elements, and wherein:

FIG. 6 is a flowchart illustrating a control method for dimension prediction in accordance with various embodiments;

FIG. 7 illustrates example vehicle dimensions in accordance with various embodiments;

FIG. 8 is a conceptual illustration of a known vehicle dimension database in accordance with various embodiments;

DETAILED DESCRIPTION

The following detailed description is merely exemplary in nature and is not intended to limit the application and uses. Furthermore, there is no intention to be bound by any expressed or implied theory presented in the preceding technical field, background, brief summary, or the following detailed description. As used herein, the term "module" refers to any hardware, software, firmware, electronic control component, processing logic, and/or processor device, individually or in any combination, including without limitation: application specific integrated circuit (ASIC), a field-programmable gate-array (FPGA), an electronic circuit, a processor (shared, dedicated, or group) and memory that executes one or more software or firmware programs, a combinational logic circuit, and/or other suitable components that provide the described functionality.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems, and that the systems described herein is merely exemplary embodiments of the present disclosure.

For the sake of brevity, conventional techniques related to signal processing, data transmission, signaling, control, autonomous vehicles, machine learning, image analysis, neural networks, lidar, analytical geometry, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Figure 1:
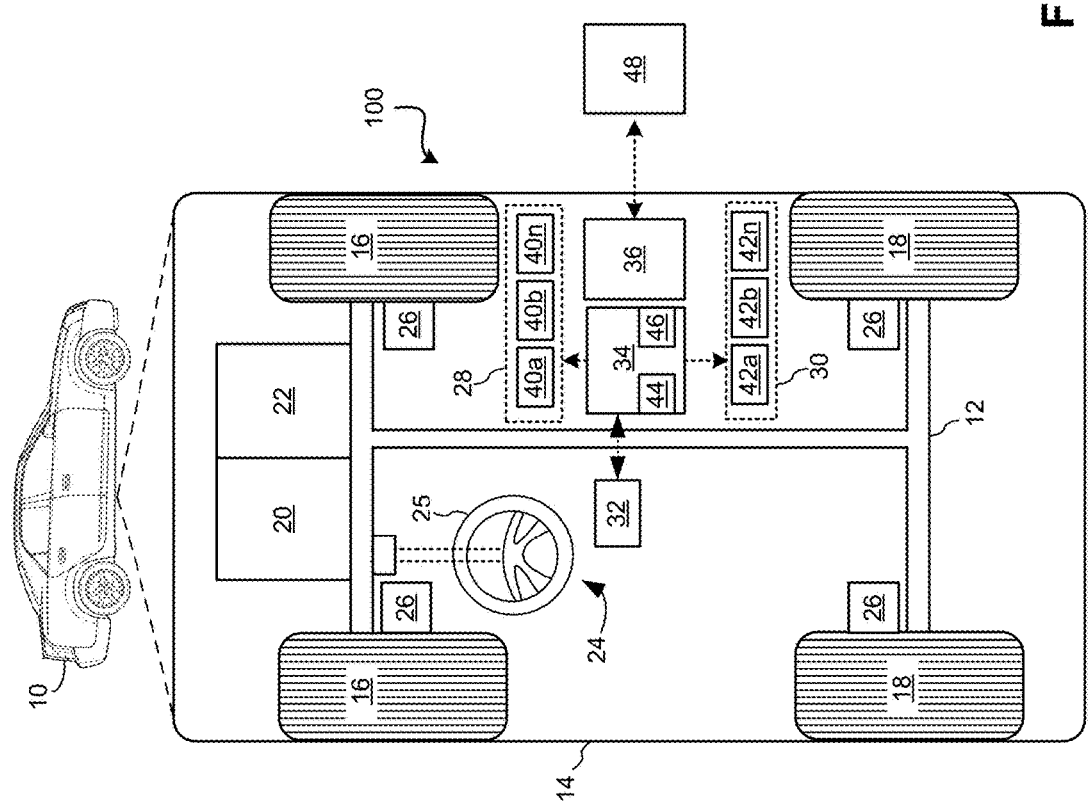
FIG. 1 is a functional block diagram illustrating an autonomous vehicle including a system in accordance with various embodiments.

With reference to FIG. 1, a vehicle dimension prediction system (or simply "system") 100 is associated with an autonomous vehicle (AV) 10 in accordance with various embodiments. In general, vehicle dimension prediction system 100 includes a machine learning (ML) model (e.g., a neural network or decision tree) capable of predicting the actual dimensions of a vehicle in the vicinity of AV 10. Using a database of known vehicle dimensions for a large number of vehicle models, a ML model is trained based on simulated sensor data associated with those known dimensions. The resulting ML model takes as its input the observed dimensions of a vehicle (e.g., the apparent height, width, and length as seen from the viewpoint of AV 10), and produces as its output a predicted actual value of those dimensions.

Referring now to FIG. 1, an autonomous vehicle ("AV" or simply "vehicle") 10 generally includes a chassis 12, a body 14, front wheels 16, and rear wheels 18. The body 14 is arranged on the chassis 12 and substantially encloses components of the vehicle 10. The body 14 and the chassis 12 may jointly form a frame. The wheels 16-18 are each rotationally coupled to the chassis 12 near a respective corner of the body 14.

In various embodiments, vehicle 10 is an autonomous vehicle and vehicle dimension prediction system 100 is incorporated into the autonomous vehicle 10. The autonomous vehicle 10 is, for example, a vehicle that is automatically controlled to carry passengers from one location to another. The vehicle 10 is depicted in the illustrated embodiment as a passenger car, but it should be appreciated that any other vehicle, including motorcycles, trucks, sport utility vehicles (SUVs), recreational vehicles (RVs), marine vessels, aircraft, etc., can also be used.

In an exemplary embodiment, the autonomous vehicle 10 corresponds to a level four or level five automation system under the Society of Automotive Engineers (SAE) "J3016" standard taxonomy of automated driving levels. Using this terminology, a level four system indicates "high automation," referring to a driving mode in which the automated driving system performs all aspects of the dynamic driving task, even if a human driver does not respond appropriately to a request to intervene. A level five system, on the other hand, indicates "full automation," referring to a driving mode in which the automated driving system performs all aspects of the dynamic driving task under all roadway and environmental conditions that can be managed by a human driver. It will be appreciated, however, that the embodiments in accordance with the present subject matter are not limited to any particular taxonomy or rubric of automation categories. Furthermore, systems and methods in accordance with the present embodiment may be used in conjunction with any autonomous vehicle that utilizes a navigation system to provide route guidance.

As shown, the autonomous vehicle 10 generally includes a propulsion system 20, a transmission system 22, a steering system 24, a brake system 26, a sensor system 28, an actuator system 30, at least one data storage device 32, at least one controller 34, and a communication system 36. The propulsion system 20 may, in various embodiments, include an internal combustion engine, an electric machine such as a traction motor, and/or a fuel cell propulsion system. The transmission system 22 is configured to transmit power from the propulsion system 20 to the vehicle wheels 16 and 18 according to selectable speed ratios. According to various embodiments, the transmission system 22 may include a step-ratio automatic transmission, a continuously-variable transmission, or other appropriate transmission.

The brake system 26 is configured to provide braking torque to the vehicle wheels 16 and 18. Brake system 26 may, in various embodiments, include friction brakes, brake by wire, a regenerative braking system such as an electric machine, and/or other appropriate braking systems.

The steering system 24 influences a position of the vehicle wheels 16 and/or 18. While depicted as including a steering wheel 25 for illustrative purposes, in some embodiments contemplated within the scope of the present disclosure, the steering system 24 may not include a steering wheel.

The sensor system 28 includes one or more sensing devices 40a-40n that sense observable conditions of the exterior environment and/or the interior environment of the autonomous vehicle 10. The sensing devices 40a-40n might include, but are not limited to, radars, lidars, global positioning systems, optical cameras, thermal cameras, ultrasonic sensors, and/or other sensors. The actuator system 30 includes one or more actuator devices 42a-42n that control one or more vehicle features such as, but not limited to, the propulsion system 20, the transmission system 22, the steering system 24, and the brake system 26. In various embodiments, autonomous vehicle 10 may also include interior and/or exterior vehicle features not illustrated in FIG. 1, such as various doors, a trunk, and cabin features such as air, music, lighting, touch-screen display components (such as those used in connection with navigation systems), and the like.

The data storage device 32 stores data for use in automatically controlling the autonomous vehicle 10. In various embodiments, the data storage device 32 stores defined maps of the navigable environment. In various embodiments, the defined maps may be predefined by and obtained from a remote system (described in further detail with regard to FIG. 2). For example, the defined maps may be assembled by the remote system and communicated to the autonomous vehicle 10 (wirelessly and/or in a wired manner) and stored in the data storage device 32. Route information may also be stored within data device 32—i.e., a set of road segments (associated geographically with one or more of the defined maps) that together define a route that the user may take to travel from a start location (e.g., the user's current location) to a target location. As will be appreciated, the data storage device 32 may be part of the controller 34, separate from the controller 34, or part of the controller 34 and part of a separate system.

The controller 34 includes at least one processor 44 and a computer-readable storage device or media 46. The processor 44 may be any custom-made or commercially available processor, a central processing unit (CPU), a graphics processing unit (GPU), an auxiliary processor among several processors associated with the controller 34, a semiconductor-based microprocessor (in the form of a microchip or chip set), any combination thereof, or generally any device for executing instructions. The computer readable storage device or media 46 may include volatile and nonvolatile storage in read-only memory (ROM), random-access memory (RAM), and keep-alive memory (KAM), for example. KAM is a persistent or non-volatile memory that may be used to store various operating variables while the processor 44 is powered down. The computer-readable storage device or media 46 may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller 34 in controlling the autonomous vehicle 10.

The instructions may include one or more separate programs, each of which comprises an ordered listing of executable instructions for implementing logical functions. The instructions, when executed by the processor 44, receive and process signals from the sensor system 28, perform logic, calculations, methods and/or algorithms for automatically controlling the components of the autonomous vehicle 10, and generate control signals that are transmitted to the actuator system 30 to automatically control the components of the autonomous vehicle 10 based on the logic, calculations, methods, and/or algorithms. Although only one controller 34 is shown in FIG. 1, embodiments of the autonomous vehicle 10 may include any number of controllers 34 that communicate over any suitable communication medium or a combination of communication mediums and that cooperate to process the sensor signals, perform logic, calculations, methods, and/or algorithms, and generate control signals to automatically control features of the autonomous vehicle 10. In one embodiment, as discussed in detail below, controller 34 is configured to classify objects in the environment using an ML model that has been previously trained based on the nature of the bounding curve associated with such objects.

Figure 2:
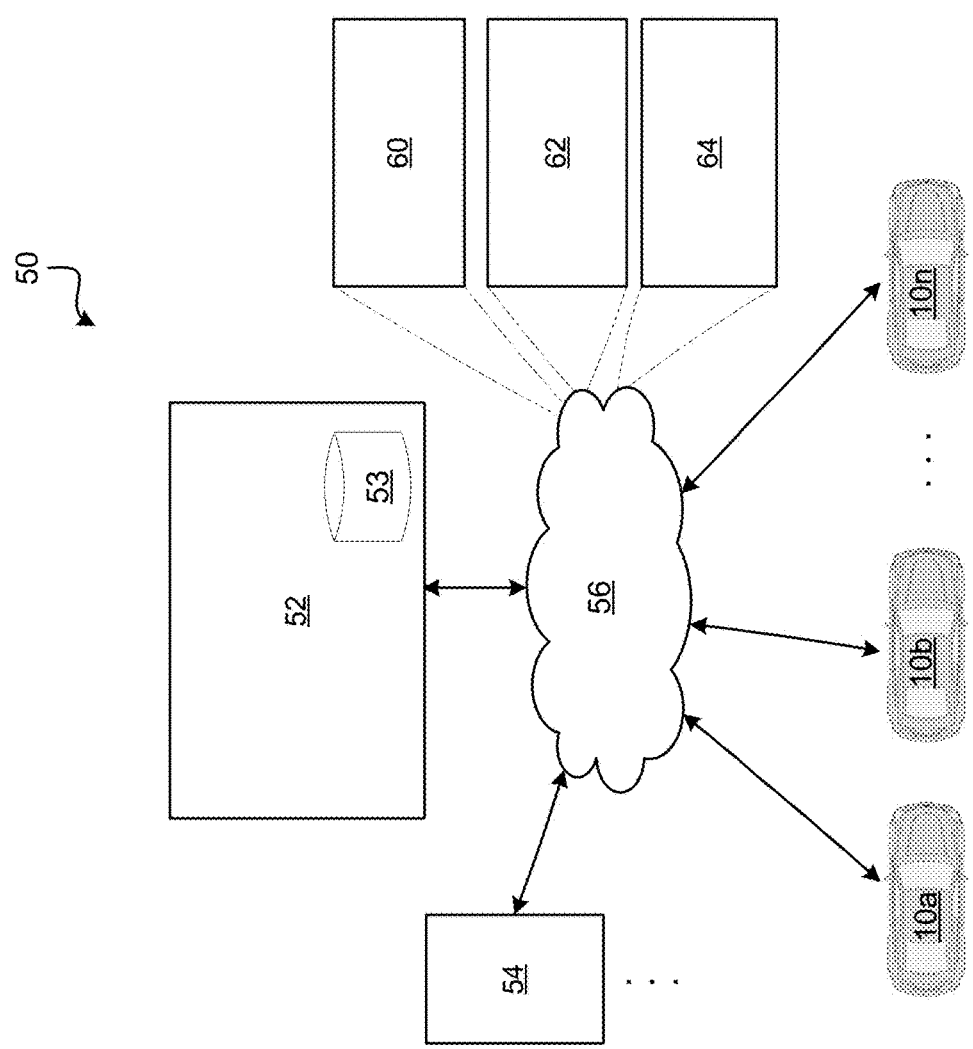
FIG. 2 is a functional block diagram illustrating a transportation system having one or more autonomous vehicles as shown in FIG. 1, in accordance with various embodiments.

The communication system 36 is configured to wirelessly communicate information to and from other entities 48, such as but not limited to, other vehicles ("V2V" communication), infrastructure ("V2I" communication), remote transportation systems, and/or user devices (described in more detail with regard to FIG. 2). In an exemplary embodiment, the communication system 36 is a wireless communication system configured to communicate via a wireless local area network (WLAN) using IEEE 802.11 standards or by using cellular data communication. However, additional or alternate communication methods, such as a dedicated short-range communications (DSRC) channel, are also considered within the scope of the present disclosure. DSRC channels refer to one-way or two-way short-range to medium-range wireless communication channels specifically designed for automotive use and a corresponding set of protocols and standards.

With reference now to FIG. 2, in various embodiments, the autonomous vehicle 10 described with regard to FIG. 1 may be suitable for use in the context of a taxi or shuttle system in a certain geographical area (e.g., a city, a school or business campus, a shopping center, an amusement park, an event center, or the like) or may simply be managed by a remote system. For example, the autonomous vehicle 10 may be associated with an autonomous vehicle based remote transportation system. FIG. 2 illustrates an exemplary embodiment of an operating environment shown generally at 50 that includes an autonomous vehicle based remote transportation system (or simply "remote transportation system") 52 that is associated with one or more autonomous vehicles 10a-10n as described with regard to FIG. 1. In various embodiments, the operating environment 50 (all or a part of which may correspond to entities 48 shown in FIG. 1) further includes one or more user devices 54 that communicate with the autonomous vehicle 10 and/or the remote transportation system 52 via a communication network 56.

The communication network 56 supports communication as needed between devices, systems, and components supported by the operating environment 50 (e.g., via tangible communication links and/or wireless communication links). For example, the communication network 56 may include a wireless carrier system 60 such as a cellular telephone system that includes a plurality of cell towers (not shown), one or more mobile switching centers (MSCs) (not shown), as well as any other networking components required to connect the wireless carrier system 60 with a land communications system. Each cell tower includes sending and receiving antennas and a base station, with the base stations from different cell towers being connected to the MSC either directly or via intermediary equipment such as a base station controller. The wireless carrier system 60 can implement any suitable communications technology, including for example, digital technologies such as CDMA (e.g., CDMA2000), LTE (e.g., 4G LTE or 5G LTE), GSM/GPRS, or other current or emerging wireless technologies. Other cell tower/base station/MSC arrangements are possible and could be used with the wireless carrier system 60. For example, the base station and cell tower could be co-located at the same site or they could be remotely located from one another, each base station could be responsible for a single cell tower or a single base station could service various cell towers, or various base stations could be coupled to a single MSC, to name but a few of the possible arrangements.

Apart from including the wireless carrier system 60, a second wireless carrier system in the form of a satellite communication system 64 can be included to provide uni-directional or bi-directional communication with the autonomous vehicles 10a-10n. This can be done using one or more communication satellites (not shown) and an uplink transmitting station (not shown). Uni-directional communication can include, for example, satellite radio services, wherein programming content (news, music, etc.) is received by the transmitting station, packaged for upload, and then sent to the satellite, which broadcasts the programming to subscribers. Bi-directional communication can include, for example, satellite telephony services using the satellite to relay telephone communications between the vehicle 10 and the station. The satellite telephony can be utilized either in addition to or in lieu of the wireless carrier system 60.

A land communication system 62 may further be included that is a conventional land-based telecommunications network connected to one or more landline telephones and connects the wireless carrier system 60 to the remote transportation system 52. For example, the land communication system 62 may include a public switched telephone network (PSTN) such as that used to provide hardwired telephony, packet-switched data communications, and the Internet infrastructure. One or more segments of the land communication system 62 can be implemented through the use of a standard wired network, a fiber or other optical network, a cable network, power lines, other wireless networks such as wireless local area networks (WLANs), or networks providing broadband wireless access (BWA), or any combination thereof. Furthermore, the remote transportation system 52 need not be connected via the land communication system 62, but can include wireless telephony equipment so that it can communicate directly with a wireless network, such as the wireless carrier system 60.

Although only one user device 54 is shown in FIG. 2, embodiments of the operating environment 50 can support any number of user devices 54, including multiple user devices 54 owned, operated, or otherwise used by one person. Each user device 54 supported by the operating environment 50 may be implemented using any suitable hardware platform. In this regard, the user device 54 can be realized in any common form factor including, but not limited to: a desktop computer; a mobile computer (e.g., a tablet computer, a laptop computer, or a netbook computer); a smartphone; a video game device; a digital media player; a component of a home entertainment equipment; a digital camera or video camera; a wearable computing device (e.g., smart watch, smart glasses, smart clothing); or the like. Each user device 54 supported by the operating environment 50 is realized as a computer-implemented or computer-based device having the hardware, software, firmware, and/or processing logic needed to carry out the various techniques and methodologies described herein. For example, the user device 54 includes a microprocessor in the form of a programmable device that includes one or more instructions stored in an internal memory structure and applied to receive binary input to create binary output. In some embodiments, the user device 54 includes a GPS module capable of receiving GPS satellite signals and generating GPS coordinates based on those signals. In other embodiments, the user device 54 includes cellular communications functionality such that the device carries out voice and/or data communications over the communication network 56 using one or more cellular communications protocols, as are discussed herein. In various embodiments, the user device 54 includes a visual display, such as a touch-screen graphical display, or other display.

The remote transportation system 52 includes one or more backend server systems, not shown), which may be cloud-based, network-based, or resident at the particular campus or geographical location serviced by the remote transportation system 52. The remote transportation system 52 can be manned by a live advisor, an automated advisor, an artificial intelligence system, or a combination thereof. The remote transportation system 52 can communicate with the user devices 54 and the autonomous vehicles 10a-10n to schedule rides, dispatch autonomous vehicles 10a-10n, and the like. In various embodiments, the remote transportation system 52 stores store account information such as subscriber authentication information, vehicle identifiers, profile records, biometric data, behavioral patterns, and other pertinent subscriber information. In one embodiment, as described in further detail below, remote transportation system 52 includes a route database 53 that stores information relating to navigational system routes.

In accordance with a typical use case workflow, a registered user of the remote transportation system 52 can create a ride request via the user device 54. The ride request will typically indicate the passenger's desired pickup location (or current GPS location), the desired destination location (which may identify a predefined vehicle stop and/or a user-specified passenger destination), and a pickup time. The remote transportation system 52 receives the ride request, processes the request, and dispatches a selected one of the autonomous vehicles 10a-10n (when and if one is available) to pick up the passenger at the designated pickup location and at the appropriate time. The transportation system 52 can also generate and send a suitably configured confirmation message or notification to the user device 54, to let the passenger know that a vehicle is on the way.

As can be appreciated, the subject matter disclosed herein provides certain enhanced features and functionality to what may be considered as a standard or baseline autonomous vehicle 10 and/or an autonomous vehicle based remote transportation system 52. To this end, an autonomous vehicle and autonomous vehicle based remote transportation system can be modified, enhanced, or otherwise supplemented to provide the additional features described in more detail below.

Figure 3:
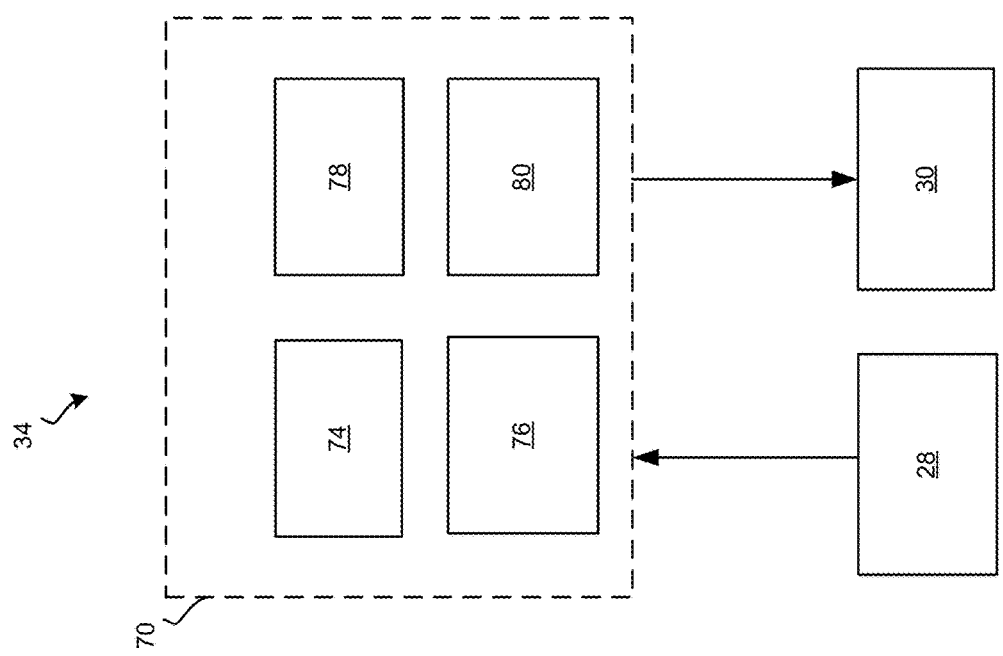
FIG. 3 is functional block diagram illustrating an autonomous driving system (ADS) associated with an autonomous vehicle, in accordance with various embodiments.

In accordance with various embodiments, controller 34 implements an autonomous driving system (ADS) 70 as shown in FIG. 3. That is, suitable software and/or hardware components of controller 34 (e.g., processor 44 and computer-readable storage device 46) are utilized to provide an autonomous driving system 70 that is used in conjunction with vehicle 10.

In various embodiments, the instructions of the autonomous driving system 70 may be organized by function or system. For example, as shown in FIG. 3, the autonomous driving system 70 can include a sensor fusion system 74, a positioning system 76, a guidance system 78, and a vehicle control system 80. As can be appreciated, in various embodiments, the instructions may be organized into any number of systems (e.g., combined, further partitioned, etc.) as the disclosure is not limited to the present examples.

In various embodiments, the sensor fusion system 74 synthesizes and processes sensor data and predicts the presence, location, classification, and/or path of objects and features of the environment of the vehicle 10. In various embodiments, the sensor fusion system 74 can incorporate information from multiple sensors, including but not limited to cameras, lidars, radars, and/or any number of other types of sensors.

The positioning system 76 processes sensor data along with other data to determine a position (e.g., a local position relative to a map, an exact position relative to lane of a road, vehicle heading, velocity, etc.) of the vehicle 10 relative to the environment. The guidance system 78 processes sensor data along with other data to determine a path for the vehicle 10 to follow. The vehicle control system 80 generates control signals for controlling the vehicle 10 according to the determined path.

In various embodiments, the controller 34 implements machine learning techniques to assist the functionality of the controller 34, such as feature detection/classification, obstruction mitigation, route traversal, mapping, sensor integration, ground-truth determination, and the like.

In accordance with various embodiments, controller 34 implements an autonomous driving system (ADS) as shown in FIG. 3. That is, suitable software and/or hardware components of controller 34 (e.g., processor 44 and computer-readable storage device 46) are utilized to provide an ADS 70 that is used in conjunction with vehicle 10.

In various embodiments, the instructions of the autonomous driving system 70 may be organized by function or system. For example, as shown in FIG. 3, the autonomous driving system 70 can include a sensor fusion system 74, a positioning system 76, a guidance system 78, and a vehicle control system 80. As can be appreciated, in various embodiments, the instructions may be organized into any number of systems (e.g., combined, further partitioned, etc.) as the disclosure is not limited to the present examples.

In various embodiments, the sensor fusion system 74 synthesizes and processes sensor data and predicts the presence, location, classification, and/or path of objects and features of the environment of the vehicle 10. In various embodiments, the sensor fusion system 74 can incorporate information from multiple sensors, including but not limited to cameras, lidars, radars, and/or any number of other types of sensors.

The positioning system 76 processes sensor data along with other data to determine a position (e.g., a local position relative to a map, an exact position relative to lane of a road, vehicle heading, velocity, etc.) of the vehicle 10 relative to the environment. The guidance system 78 processes sensor data along with other data to determine a path for the vehicle 10 to follow. The vehicle control system 80 generates control signals for controlling the vehicle 10 according to the determined path.

In various embodiments, the controller 34 implements machine learning techniques to assist the functionality of the controller 34, such as feature detection/classification, obstruction mitigation, route traversal, mapping, sensor integration, ground-truth determination, and the like.

As mentioned briefly above, system 100 of FIG. 1 is capable of predicting the actual dimensions of another vehicle in the vicinity of AV 10 based on a previously trained ML model. In various embodiments, the ML model is trained using simulated sensor results (e.g., simulated lidar clouds) derived from a database of known dimensions for actual vehicle models likely to be encountered by AV during actual operation.

Figure 4:
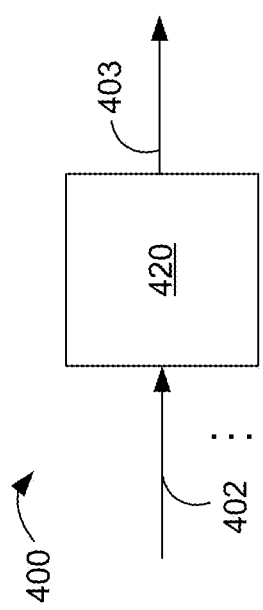
FIG. 4 is a dataflow diagram illustrating a vehicle dimension prediction system in accordance with various embodiments.

FIG. 4 is a dataflow diagram that illustrates various embodiments of the system 100 which may be embedded within the controller 34. Referring to FIG. 4, an exemplary system 400 generally includes a vehicle dimension prediction module 420 that receives sensor data 402 relating to observed dimensions of a vehicle encountered in the environment (e.g., camera images, lidar data, or any other sensor data received from sensor system 28) and has, as its output 403, predicted actual dimensions of that vehicle. In various embodiments, module 420 implements an ML model that has been previously trained using a corpus of example images produced through simulated sensor data based on a database of known vehicle dimensions.

It will be understood that various embodiments of the system 100 according to the present disclosure can include any number of sub-modules embedded within the controller 34. As can be appreciated, then, any modules/sub-modules shown in FIG. 4 can be combined and/or further partitioned to similarly perform the various methods described herein. Inputs to the system 100 may be received from the sensor system 28, received from other control modules (not shown) associated with the autonomous vehicle 10, received from the communication system 36, and/or determined/modeled by other sub-modules (not shown) within the controller 34 of FIG. 1. Module 420 may be implemented, for example, within any of the various modules illustrated in FIG. 3.

Figure 5:
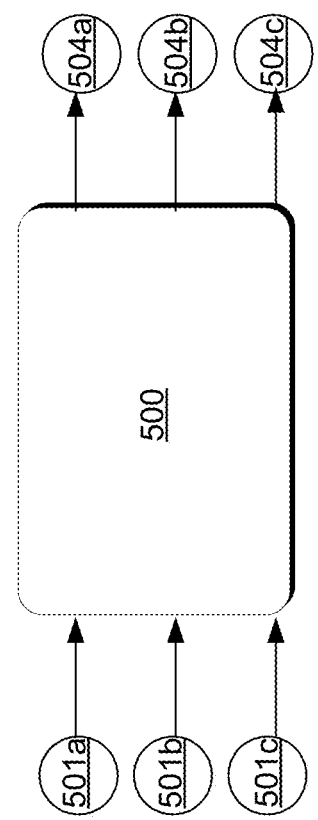
FIG. 5 is a conceptual block diagram of a machine language (ML) model in accordance with various embodiments.

Vehicle dimension prediction module 420 may implement a variety of machine learning models trained using a set of images and other data previously acquired and stored (e.g., in server 53 of FIG. 2). In that regard, FIG. 5 is a conceptual overview of an ML model 500 that might be used in connection with various embodiments.

ML model 500 includes a number of inputs 501 (e.g., 501a-501c) and a number of outputs 504 (e.g., 504a-504c). In the illustrated embodiment, inputs 501a, 501b, and 501c correspond, respectively, to the observed height, width, and length of the vehicle observed by AV 10 (e.g., real numbers representing distance in meters or other appropriate units), and outputs 504a, 504b, and 504c correspond, respectively, to the predicted actual height, width, and length of the vehicle observed by AV 10. In this regard, depending upon the particular sensors data used to measure these attributes, the observed height, width, and length may be based on a simple linear measure determined by AV 10, or may be based on a more detailed measure that takes into account depth information derived from the sensor data. For example, in the event that lidar data (which includes distance information) is used to determine the observed length 501c, and the observed vehicle is facing AV 10 at an oblique angle, then the observed length might be estimated by first estimating the angle of the oncoming car and then accounting for that angle in computing observed length 501c. Observed width 501b and observed height 501a may be similarly computed, though it should be noted that due to the generally lateral movement of vehicles on a roadway, the observed height 501a will typically be substantially the same as the predicted actual output of length 504c (except in cases where the observed vehicle is on an incline, etc.)

ML model 500 is, in various embodiments, "trained" via a learning rule that allows it to effectively learn by example. Such learning may be supervised (with known examples provided as input), unsupervised (with uncategorized examples provided as input), or involve reinforcement learning (where some notion of "reward" is provided during training). Once ML model 500 is 'trained' to a satisfactory level it may be used as an analytical tool to make predictions during normal operation of AV 10.

As will be described in detail below, ML model 500 of FIG. 5 may be used to implement classification module 420 of FIG. 4 by accepting inputs 501 corresponding to observed dimensions of a vehicle in the vicinity of AV 10 and producing as an output 504 predicted actual values of those dimensions.

ML model 500 may be implemented using a variety of machine learning techniques known in the art. In one embodiment, ML model 500 is implemented using an artificial network, such as a recurrent neural networks (RNN). In another embodiment, ML model 500 is implemented using a decision tree model. In other embodiments, ML model is implemented using a random forest model, Bayes classifiers (e.g., naive Bayes), a principal component analysis (PCA) model, a clustering model, a support vector machine model, a linear discriminant analysis model, a regression model, an ensemble model, or any other model that may be efficacious in producing numerical values corresponding to predicted dimensions based on numerical values corresponding to observed dimensions.

Figure 9:
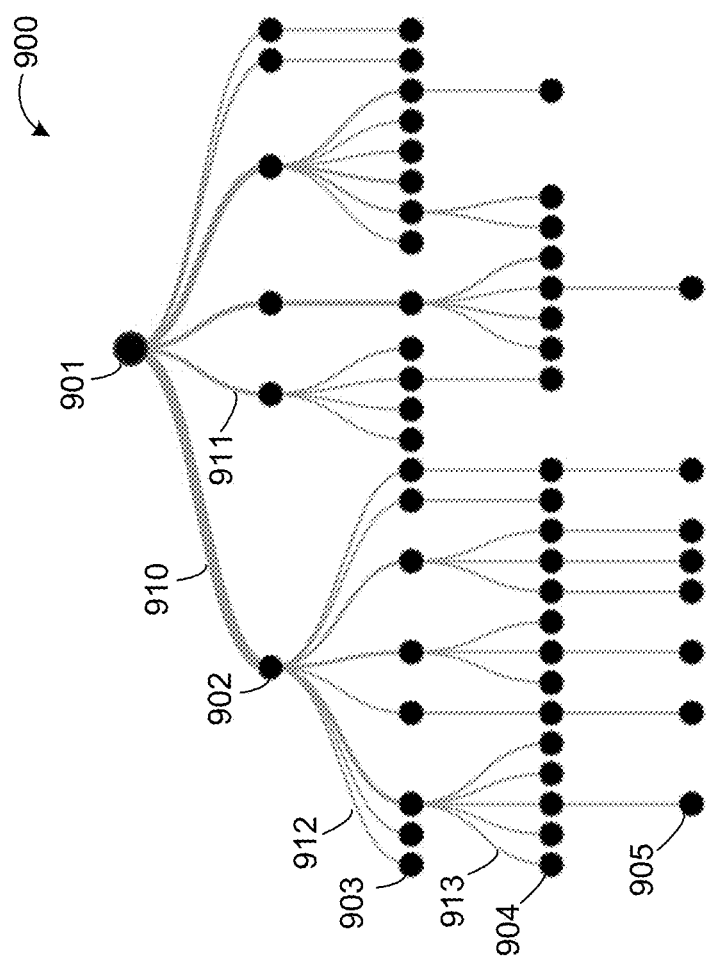
FIG. 9 illustrates a dimension-based decision tree in accordance with various embodiments.
Figure 10:
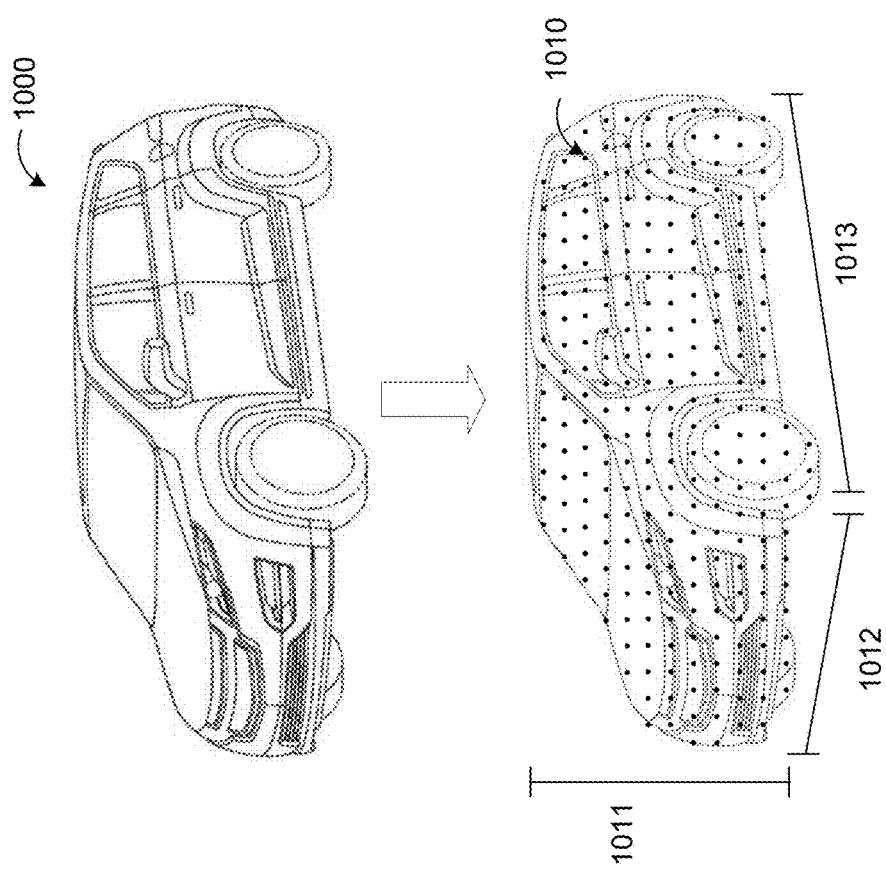
FIG. 10 illustrates the simulation of a lidar point cloud in accordance with various embodiments.

FIG. 6 is a flowchart illustrating a control method for vehicle dimension prediction in accordance with various embodiments, and will be described now in conjunction with FIGS. 1-5 as well as FIGS. 7-10. In general, and as described in further detail below, FIG. 7 illustrates example dimensions of a known vehicle, and FIG. 8 illustrates, conceptually, an example database of known vehicle dimensions. FIG. 9 depicts a dimension-based decision tree in accordance with various embodiments, and FIG. 10 depicts the generation of simulated lidar data in accordance with various embodiments.

Referring now to FIG. 6, a control method 600 can be performed by the system 100 of FIG. 1 in conjunction with the vehicle dimension prediction module 420 of FIG. 4. As will be appreciated in light of the disclosure, the order of operation within method 600 is not limited to the sequential execution as illustrated in FIG. 6, but may be performed in one or more varying orders as applicable and in accordance with the present disclosure.

Control method 600 begins at 601 with the compilation of a database of known vehicle dimensions. Such a database is illustrated, conceptually, in FIG. 8, which shows a database 800 having a number of fields (801-804) that characterize the set of vehicle dimensions being considered by vehicle dimension prediction module 420. For example, in FIG. 8, database 800 might include a vehicle identification field 801 (e.g., a unique ID related to the particular year, make, and model of the actual vehicle, such as "2018 CHEVY BOLT"), as well as a height field 802, a width field 803, and length field 804. Referring briefly to FIG. 7, these values are illustrated, respectively, as a height 702, length 703, and width 704 of an exemplary vehicle 700. In some embodiments, greater or fewer dimensions are used. For example, in various embodiments only the vehicle width 803 and length 804 are compiled.

Database 800 may be populated or otherwise compiled in a number of ways, and may be stored in any convenient manner (e.g., within database 53 of FIG. 2). For example, database 800 may be derived from a publicly available database, server, or website, that includes information regarding the dimensions of new and/or used cars. In other embodiments, database 800 is populated in an automated and/or manual fashion by direct observation and measurement of vehicles in the environment.

Next, at 602, a corpus (or set) of simulated observed dimensions are produced based on database of known vehicle dimensions 800. This corpus of training data might include, for example, a large set of images including sensor data corresponding to vehicles that are likely to be encountered by AV 10 (e.g., at various orientations relative to AV 10) along with known actual dimensions associated with those images (e.g., fields 802-804 of FIG. 8).

In one embodiment, the simulated observed dimensions are produced as shown in FIGS. 9 and 10 by first optimizing (or otherwise training) a decision tree 900 to effectively represent the knowledge gained via database 800 and then randomly (or systematically) generating example vehicles and corresponding simulated sensor data based on decision tree 900.

Dimension-based decision tree 900 generally includes a set of nodes (e.g., 901-905) and branches (e.g., 910-913) between those nodes. The nodes 901-905 represent decision points (and consequently, sets of vehicles corresponding to certain ranges of dimensions), and the branches (910-913) correspond to criteria associated with nodes lower on the tree. The "leaf" nodes (i.e., endpoints of the tree having no child nodes, such as nodes 903, 904, and 905) correspond to individual vehicle IDs 801 (or logically grouped IDs of similar vehicles) from database 800. Thus, for example, branch 910 might correspond to the criterion "length <4.5 meters", branch 901 might correspond to the criterion "length >=4.5 meters and length <5.2 meters", and so on. Each branch (910-913) might include any number of conditionals based on the various dimensions compiled in database 800. Thus, it will be apparent that representative, actual car dimensions may be generated by simply traversing tree 900 from the top to the bottom either randomly or systematically (e.g., to generate example vehicles that conform to the ratios of dimensions typically encountered in the real world). In another embodiment, rather than utilize a decision tree 900, example vehicles are randomly or systematically selected directly from database 800.

Regardless of how vehicle dimensions are selected for simulation, suitable software is then employed to simulate sensor data corresponding to a vehicle having the selected dimensions and orientation in space. This procedure is illustrated, for example, in FIG. 10, which shows an example oncoming vehicle 1000 oriented at approximately a 45 degree angle with respect to the plane of the drawing (also assumed to be the viewpoint of the AV 10 observing vehicle 1000). The system then simulates the sensor data that might result from observing vehicle 1000. In the illustrated embodiment, for example, a lidar point cloud 1010 is shown, although any other type of sensor data may be simulated (e.g., optical data, radar data, etc.). Using known techniques, the observed length (1013), observed width (1012), and observed height (1011) can then be used to produce a set of simulated observed dimensions that can be used as input(s) 501 of FIG. 5.

The above simulation procedure may be performed, for example, via a server and/or appropriate software residing within system 52 of FIG. 2. Systems and software for simulating the presence of a vehicle within a 3D virtual space and determining the lidar and/or other sensor data that might be produced by such a simulated vehicle are known in the art, and need not be described in detail herein.

With continued reference to FIG. 6, at 503 the simulated observed dimensions from 603 are used in connection with the known vehicle dimensions (as simulated based on decision tree 900 or otherwise derived from database 800) to train ML model 500. For example, in the embodiment in which ML model 500 is a neural network, the simulated observed dimensions are applied to the input nodes 501a-c while the known vehicle dimensions are applied to the output nodes 504a-c. Backpropagation or other techniques are then used to train ML model 500. In the embodiment in which ML model 500 is a decision tree, a suitable tree training/optimization techniques is used to produce the desired ML model 500.

Next, at 604, sensor data is acquired by the AV 10 during normal operation. As mentioned above, the sensor data might include any available data acquired by sensor system 28 during operation of AV 10. In various embodiments, lidar data of an observed vehicle is of particular interest in the vehicle dimension prediction process. Nevertheless, the embodiments described herein are not so limited, and any available sensor data may be used.

Next, at 605 the observed dimensions of vehicle are determined based on the sensor data acquired at 604. As mentioned above in connection with FIG. 5, in one embodiment this classification will generally include feeding the extracted observed dimensions (e.g., height, width, and length) into the previously trained ML model 500 as inputs 501.

In accordance with various embodiments, other data (such as mapping data stored within AV 10 or external thereto) is used as an input to trained ML model 500 or in a subsequent process to further assist in estimating actual dimensions. For example, mapping data in the vicinity of AV 10 might indicate that a wall or other previously-determined structure (whether stationary or mobile) is in such a location relative to an observed vehicle that it limits the possible dimensions of that observed vehicle. Stated another way, it might be generally assumed by the system that an observed vehicle cannot spatially intersect a nearby wall. In this way, additional information regarding the dimensions of the vehicle (e.g. width, length, etc.) can be inferred.

Finally, at 606, the predicted actual dimensions are determined via outputs 504 of ML model 500. These predicted actual dimensions can then be used by the various modules of AV 10 (e.g., any of the modules shown in FIG. 3) to more accurately carry out their respective functions. For example, path planning module 90 might use the predicted actual dimensions 504 to plan a path that avoids intersecting very long vehicles (i.e., vehicle whose length might not be apparent based solely on the available sensor data).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A vehicle dimension prediction method comprising:
   compiling a database of known vehicle dimensions for a plurality of vehicle models, the known vehicle dimensions including a known width and a known length, the database including a vehicle identification field, a width field, and a length field, the database being derived from publicly available data;
   producing a set of simulated observed dimensions based on the database of known vehicle dimensions, the set of simulated observed dimensions including a set of images of a plurality of the vehicles models at a plurality of different orientations and known actual dimensions associated with those images;
   training a machine learning model by applying the simulated observed dimensions to input nodes and the known vehicle dimensions to output nodes of the machine learning model during training;
   acquiring sensor data associated with a first vehicle observed by a sensor system of an autonomous vehicle;
   determining a plurality of observed dimensions of the first vehicle based on the acquired sensor data;
   determining, with a processor, a plurality of predicted actual dimensions of the first vehicle by applying the plurality of observed dimensions to the machine learning model, the plurality of predicted actual dimension including the known length and known width of a vehicle model whose known vehicle dimensions have been compiled in the database, wherein the autonomous vehicle is configured to use the predicted actual dimensions to plan a path that avoids intersecting the first vehicle.

2. The method of claim 1, wherein the machine learning model is an artificial neural network model.

3. The method of claim 1, wherein the machine learning model is a decision tree model.

4. The method of claim 1, wherein producing the set of simulated observed dimensions includes training a dimension-based decision tree based on the set of known vehicle dimensions and generating simulated vehicles based on the dimension-based decision tree.

5. The method of claim 4, wherein producing the set of simulated observed dimensions includes generating simulated sensor data associated with the simulated vehicles.

6. The method of claim 5, wherein the simulated sensor data is a lidar point cloud.

7. The method of claim 1, wherein the set of known vehicle dimensions includes at least a vehicle type identifier, a length of a vehicle corresponding to the vehicle type identifier, and a width of a vehicle corresponding to the vehicle type identifier.

8. The method of claim 1, further including transmitting the machine learning model to the autonomous vehicle over a communication network.

9. A system for controlling an autonomous vehicle, comprising:
   a vehicle dimension prediction module, including a processor, configured to:
      acquire sensor data associated with a first vehicle observed by a sensor system of an autonomous vehicle;
      determine a plurality of observed dimensions of the first vehicle based on the acquired sensor data; and
      determine a plurality of predicted actual dimensions of the first vehicle by applying the plurality of observed dimensions to a machine learning model, the plurality of predicted actual dimension including a known length and a known width of a vehicle model whose known vehicle dimensions have been compiled in a database of known vehicle dimensions for a plurality of vehicle models, the database including a vehicle identification field, a width field, and a length field, the database being derived from publicly available data, wherein the machine learning model is trained by producing a set of simulated observed dimensions based on the database of known vehicle dimensions, the set of simulated observed dimensions including a set of images of a plurality of the vehicles models at a plurality of different orientations and known actual dimensions associated with those images, and training the machine learning model dimensions by applying the simulated observed dimensions to input nodes and the known vehicle dimensions to output nodes of the machine learning model during training.

10. The system of claim 9, wherein the machine learning model is an artificial neural network model.

11. The system of claim 9, wherein the machine learning model is a decision tree model.

12. The system of claim 9, wherein the set of simulated observed dimensions are produced by training a dimension-based decision tree based on the set of known vehicle dimensions and generating simulated vehicles based on the dimension-based decision tree.

13. The system of claim 12, wherein the set of simulated observed dimensions are further produced by generating simulated sensor data associated with the simulated vehicles.

14. The system of claim 13, wherein the simulated sensor data is a lidar point cloud.

15. The system of claim 9, wherein the set of known vehicle dimensions includes at least a vehicle type identifier, a length of a vehicle corresponding to the vehicle type identifier, and a width of a vehicle corresponding to the vehicle type identifier.

16. An autonomous vehicle, comprising:
   at least one sensor that provides sensor data; and
   a controller that, by a processor and based on the sensor data:
      acquires sensor data associated with a first vehicle observed by a sensor system of an autonomous vehicle;
      determines a plurality of observed dimensions of the first vehicle based on the acquired sensor data; and determines a plurality of predicted actual dimensions of the first vehicle by applying the plurality of observed dimensions to a machine learning model, the plurality of predicted actual dimension including a known length and a known width of a vehicle model whose known vehicle dimensions have been compiled in a database of known vehicle dimensions for a plurality of vehicle models, the database including a vehicle identification field, a width field, and a length field, the database being derived from publicly available data, wherein the machine learning model is trained by producing a set of simulated observed dimensions based on the database of known vehicle dimensions, the set of simulated observed dimensions including a set of images of a plurality of the vehicles models at a plurality of different orientations and known actual dimensions associated with those images, and training the machine learning model dimensions by applying the simulated observed dimensions to input nodes and the known vehicle dimensions to output nodes of the machine learning model during training.

17. The autonomous vehicle of claim 16, wherein the machine learning model is selected from the group consisting of artificial neural network models and decision tree models.

18. The autonomous vehicle of claim 16, wherein the set of simulated observed dimensions are produced by training a dimension-based decision tree based on the set of known vehicle dimensions and generating simulated vehicles and simulated sensor data based on the set of known vehicle dimensions.

19. The autonomous vehicle of claim 18, wherein the simulated sensor data is a lidar point cloud.

20. The autonomous vehicle of claim 16, wherein the set of known vehicle dimensions includes at least a vehicle type identifier, a length of a vehicle corresponding to the vehicle type identifier, and a width of a vehicle corresponding to the vehicle type identifier.

* * * * *